United States Patent
Oh et al.

(10) Patent No.: US 12,514,053 B2
(45) Date of Patent: Dec. 30, 2025

(54) MICRO LED DISPLAY DEVICE AND MANUFACTURING METHOD THEREFOR

(71) Applicant: LG Display Co., Ltd., Seoul (KR)

(72) Inventors: Kummi Oh, Paju-si (KR); Seunghyo Ko, Paju-si (KR); Hyunjin Kim, Paju-si (KR); Sunwook Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 718 days.

(21) Appl. No.: 17/790,100

(22) PCT Filed: Sep. 15, 2020

(86) PCT No.: PCT/KR2020/012438
§ 371 (c)(1),
(2) Date: Jun. 29, 2022

(87) PCT Pub. No.: WO2021/137388
PCT Pub. Date: Jul. 8, 2021

(65) Prior Publication Data
US 2023/0045741 A1   Feb. 9, 2023

(30) Foreign Application Priority Data
Dec. 30, 2019  (KR) .................. 10-2019-0178068

(51) Int. Cl.
*H10K 59/131*  (2023.01)
*H10H 29/49*  (2025.01)
*H10H 29/85*  (2025.01)
*H10K 59/82*  (2023.01)
*H01L 25/075*  (2006.01)
(Continued)

(52) U.S. Cl.
CPC .......... *H10H 29/857* (2025.01); *H10H 29/49* (2025.01); *H10K 59/131* (2023.02); *H10K 59/82* (2023.02); *H01L 25/0753* (2013.01); *H01L 25/16* (2013.01); *H01L 25/167* (2013.01); *H10H 20/01* (2025.01); *H10H 20/857* (2025.01); *H10H 29/142* (2025.01)

(58) Field of Classification Search
CPC ...... H10H 29/857; H10H 29/49; H10H 20/01; H10H 20/857; H10H 29/142; H10K 59/131; H10K 59/82; H01L 25/0753; H01L 25/16; H01L 25/167
See application file for complete search history.

(56) References Cited

U.S. PATENT DOCUMENTS 7,692,191 B2   4/2010   Kwak et al.
9,111,843 B2   8/2015   Park et al.
(Continued)

FOREIGN PATENT DOCUMENTS

KR   10-2006-0087885 A   8/2006
KR     20070063735 A     6/2007
(Continued)

*Primary Examiner* — Eduardo A Rodela
(74) *Attorney, Agent, or Firm* — Seed Intellectual Property Law Group LLP

(57) ABSTRACT

According to the present specification, provided is a micro LED display device. The micro LED display device includes a substrate, a supply voltage line on the substrate, and a micro LED area disposed on the supply voltage line. At least one portion of the supply voltage line is disposed at the vertical lower part of the micro LED area.

9 Claims, 4 Drawing Sheets

(51) Int. Cl.
  *H01L 25/16* (2023.01)
  *H10H 20/01* (2025.01)
  *H10H 20/857* (2025.01)
  *H10H 29/14* (2025.01)

(56) References Cited

U.S. PATENT DOCUMENTS

| | | | | |
|---|---|---|---|---|
| 10,997,919 | B2* | 5/2021 | Kim | G09G 3/3258 |
| 11,107,869 | B2* | 8/2021 | Lee | H10K 50/00 |
| 12,158,673 | B2* | 12/2024 | Woo | H10K 59/126 |
| 2006/0028495 | A1* | 2/2006 | Phan | G09G 3/2003 |
| | | | | 345/694 |
| 2021/0272510 | A1* | 9/2021 | Huitema | G09G 3/3233 |
| 2022/0059517 | A1* | 2/2022 | Ikeda | H10H 20/855 |
| 2022/0093697 | A1* | 3/2022 | Hong | H10K 59/38 |
| 2023/0200157 | A1* | 6/2023 | Ko | H10K 71/831 |
| | | | | 257/210 |

FOREIGN PATENT DOCUMENTS

| | | |
|---|---|---|
| KR | 10-1058880 B1 | 8/2011 |
| KR | 10-2018-0023112 A | 3/2018 |
| KR | 10-2018-0078480 A | 7/2018 |
| KR | 10-2019-0099149 A | 8/2019 |

\* cited by examiner

MICRO LED DISPLAY DEVICE AND MANUFACTURING METHOD THEREFOR

BACKGROUND

Technical Field

The present disclosure relates to a micro LED display device having reduced voltage drop (IR drop) and a method for manufacturing the same.

Description of the Related Art

An electroluminescent display device receives an image signal and displays an image in a display area. The electroluminescent display device may be implemented, for example, using a micro LED (micro light emitting diode), an organic light-emitting diode (OLED), a quantum-dot light emitting diode (QLED) as an electroluminescent element.

In a micro LED display device, voltage drop (IR drop) problem is becoming an issue due to so-called high current characteristic in operation, that is, a large amount of current used in operation.

BRIEF SUMMARY

One or more embodiments of the present disclosure provide a micro LED display device with a new structure that may solve one or more technical problems in the related art including the problem identified above (e.g., the voltage drop (IR drop) problem) and a method for manufacturing the same.

One or more embodiments of the present disclosure provide a micro LED display device with a new structure suitable for a high-resolution and a large area, and a method for manufacturing the same.

One or more embodiments of the present disclosure are not limited to the technical benefits as mentioned above, and other benefits not mentioned will be clearly understood by those skilled in the art from the following description.

A micro LED display device according to one embodiment of the present disclosure includes a substrate, a supply voltage line on the substrate, and a micro LED area disposed on the supply voltage line. At least one portion of the supply voltage line is disposed directly below the micro LED area.

A method for manufacturing a micro LED display device according to an embodiment of the present disclosure includes a process of coating an insulating film on a substrate, a process of coating a supply voltage line on the substrate, a process of forming a TFT array on the insulating film and the supply voltage line, and a process of forming a micro LED array on the TFT array.

The specific details of other embodiments are included in the detailed description and drawings.

The micro LED display device according to embodiments of the present disclosure may increase or maximize area utilization within a pixel and thus have an advantageous effect for the high resolution and the large area.

The micro LED display device according to embodiments of the present disclosure may have an effect of increasing a degree of freedom in adjusting resistance of an electrode.

The micro LED display device according to embodiments of the present disclosure may have a small voltage drop (IR drop) and may not be significantly affected by the voltage drop (IR drop).

The effect according to the present disclosure is not limited to those described above, and more various effects are included in the present disclosure.

DETAILED DESCRIPTION

Figure 1:
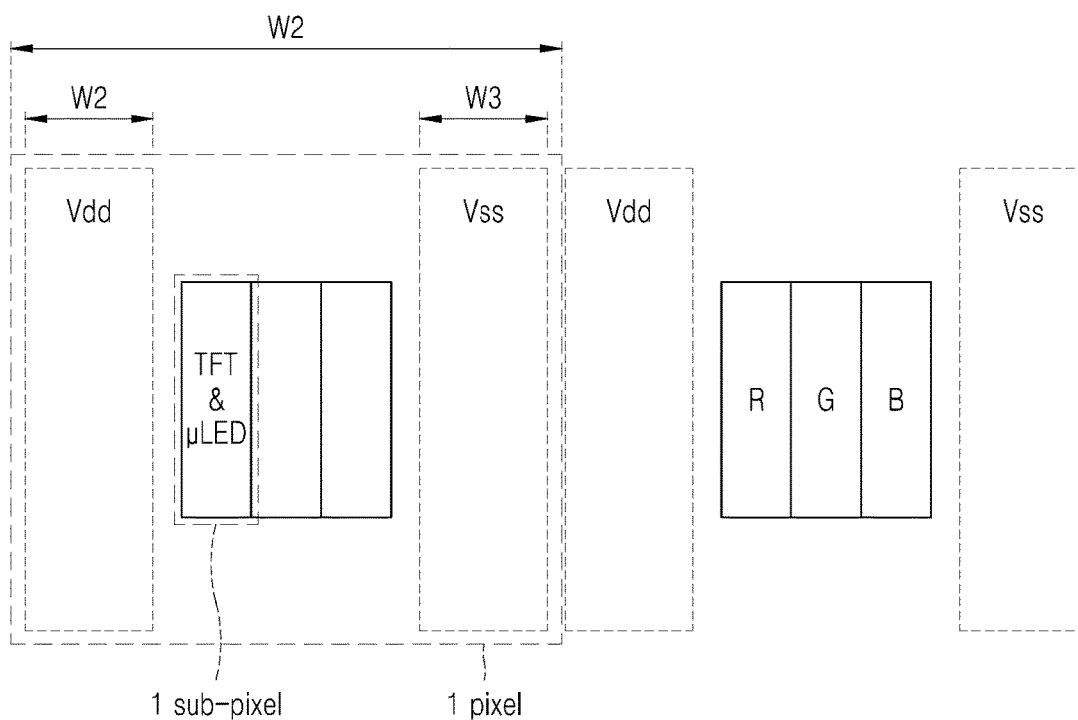
FIG. 1 is a plan view of a typical micro LED display device.

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are provided to fully inform those having common knowledge in the technical field to which the present disclosure belongs of a scope of the disclosure.

A shape, a size, a ratio, a dimension (e.g., length, width, height, thickness, radius, diameter, area, etc.), an angle, a number of elements, etc., disclosed in the drawings for illustrating embodiments of the present disclosure are examples, and the present disclosure is not limited thereto. The same reference numerals refer to the same elements herein. Further, in describing the present disclosure, when it is determined that a detailed description of a related known element may unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Like reference numerals refer to like elements throughout the disclosure.

A size and a thickness of each component shown in the drawings are shown for convenience of description. The disclosure is not necessarily limited to the size and the thickness of the component shown in the drawings even though the dimensions including the size and thickness of the components illustrated in the drawings are actual working embodiments of the present disclosure.

The features of the various embodiments of the present disclosure may be partially or entirely combined with each other, and may be technically associated with each other or operate with each other. The embodiments may be implemented independently of each other and may be implemented together in an association relationship.

Hereinafter, embodiments according to the present disclosure will be described with reference to the accompanying drawings.

Figure 2:
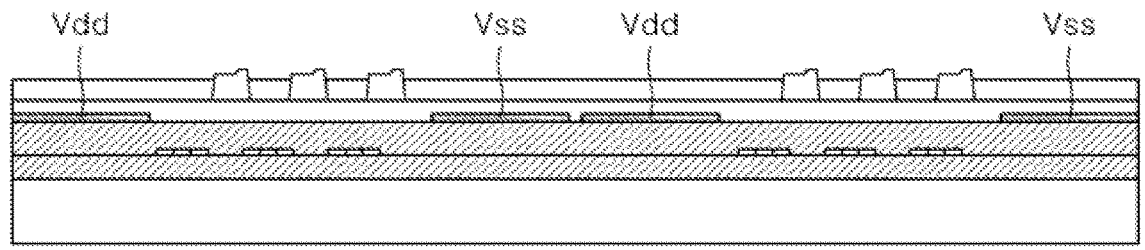
FIG. 2 is a cross-sectional view of a typical micro LED display device.

FIG. 1 is a plan view of a typical micro LED display device. FIG. 2 is a cross-sectional view of a typical micro LED display device.

First, referring to FIG. 1 and FIG. 2, the typical micro LED display device is described.

As shown in FIG. 1, the micro LED display device may include a plurality of sub-pixels per pixel and an electrode for supplying power to each of the sub-pixels.

Further, as shown in FIG. 2, in the micro LED display device, a back face of a TFT array may be disposed on a substrate, and metal lines for power supply may be disposed on the TFT array, and micro LED pixels may be disposed on the metal lines.

A metal of the metal line is not limited only to a metal material. In the present disclosure, the metal line means a conductor made of any material whose electrical properties, specifically, electrical conductivity may be classified as that of the metal. In non-limiting and specific examples, doped semiconductors and compounds such as silicide may be used as the metal in the metal line.

A micro LED panel has the so-called high current characteristics in which the panel consumes a larger amount of current in operation, compared to other LED panels such as an OLED panel. In a non-limiting and specific example, a mobile OLED panel consumes an operation current of about nanoamperes (nA), whereas the micro LED panel consumes an operation current of about microamperes (μA).

The high current characteristic in operation of the micro LED panel causes the micro LED panel to be vulnerable to voltage drop (IR drop).

Specifically, even when each of a supply voltage (or applied voltage or Vdd) electrode line for supplying power to the micro LED pixel and a substrate voltage (or ground voltage or Vss) electrode line has a large area and a large thickness and is disposed closer to the pixel as shown in FIG. 1 and FIG. 2, voltage drop (IR drop) occurs while power from the supply voltage electrode line is supplied along the substrate and the sub-pixel, thereby making it difficult to supply the same and uniform voltage to the sub-pixels. As a result, there is a problem that voltages applied to the sub-pixels within the same pixel are non-uniform.

Further, when the micro LED pixels are combined with each other to form a panel, the pixels in the panel may not receive a uniform voltage due to the voltage drop (IR drop).

For example, when one pixel in FIG. 1 has a width (W1) of about 800 μm, a maximum allowable width of each of the supply voltage and substrate voltage electrode lines is limited to about 200 μm (i.e, width of the supply voltage electrode line W2, width of the substrate voltage electrode line W3). Therefore, the micro LED panel with the structure as described above may not achieve the high definition and the large area realistically due to the limitation of the width of each of the supply voltage and substrate voltage electrode lines.

Further, in another solution for the voltage drop (IR drop), a thickness each of the supply voltage and substrate voltage electrode lines may increase. However, the increase in the thickness thereof causes increase in a process time and a material cost in a deposition process and subsequent processes, thereby reducing productivity.

Figure 3:
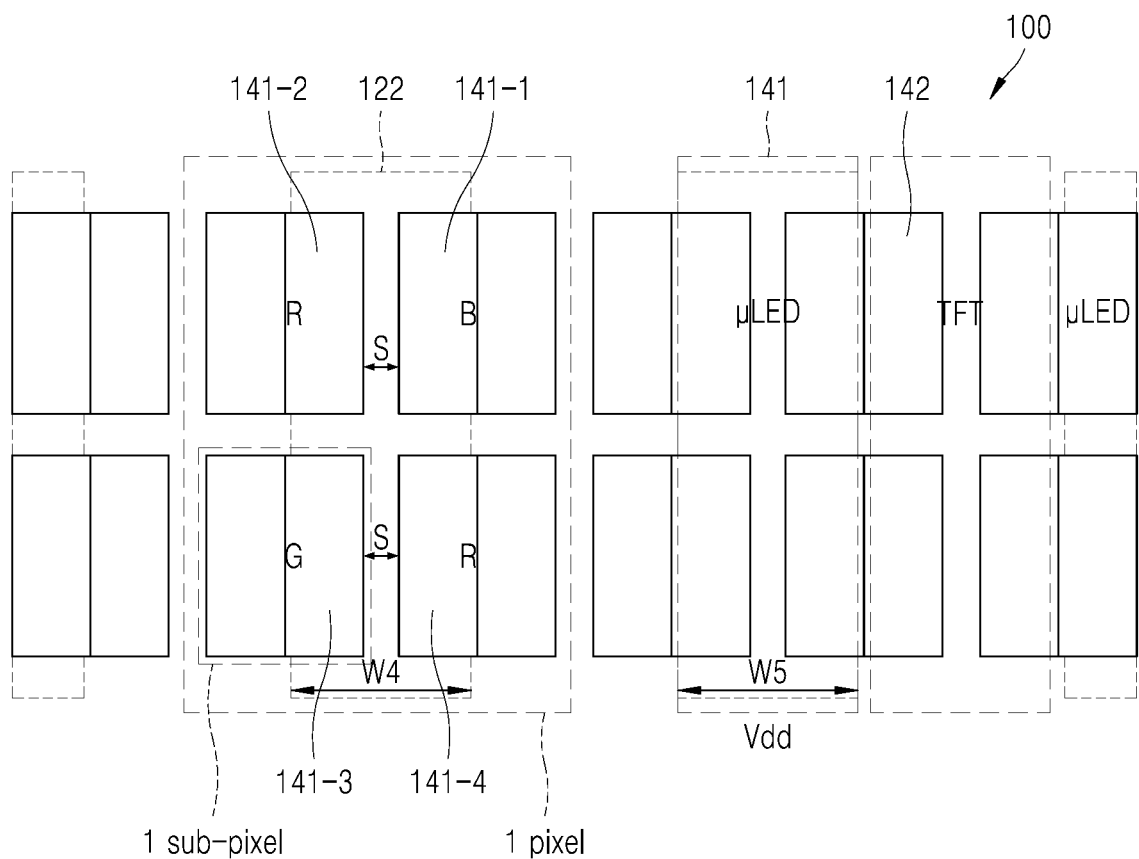
FIG. 3 is a plan view of a micro LED display device according to one embodiment of the present disclosure.
Figure 4:
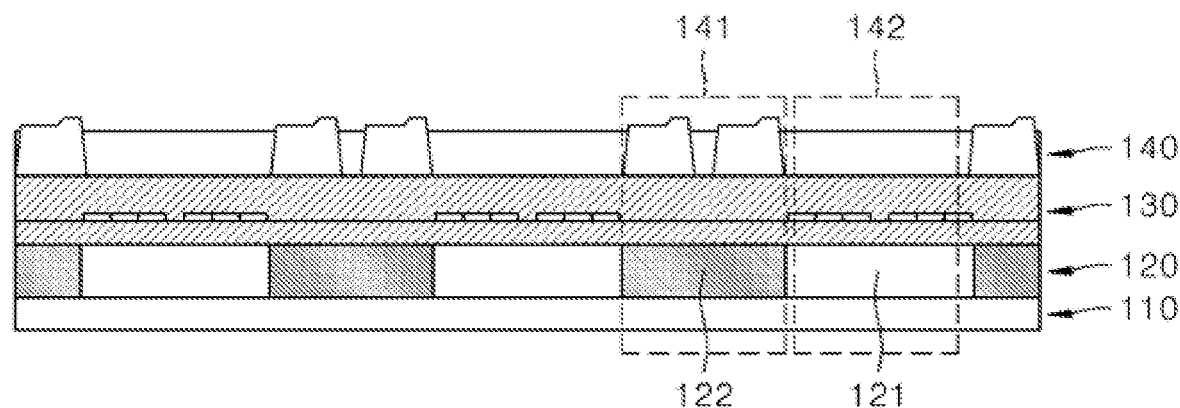
FIG. 4 is a cross-sectional view of a micro LED display device according to one embodiment of the present disclosure.

FIG. 3 is a plan view of a micro LED display device according to one embodiment of the present disclosure. FIG. 4 is a cross-sectional view of a micro LED display device according to one embodiment of the present disclosure. First, referring to FIGS. 3 and 4, a micro LED display device 100 according to one embodiment of the present disclosure will be described.

The micro LED display device 100 according to one embodiment of the present disclosure may include a substrate 110, an insulating film 121 and a supply voltage electrode 122 on the substrate 110, a thin-film transistor array 130 on the insulating film 121 and the supply voltage electrode 122, and a thin-film micro LED array 140 on the thin-film transistor array 130.

In this case, the micro LED array 140 may be configured to include a plurality of sub-pixels. Each sub-pixel may be configured to emit visible light of a specific wavelength band based on an image signal supplied through the thin-film transistor array 130. Therefore, the micro LED display device 100 according to one embodiment of the present disclosure may display an image.

The substrate 110 may be a transparent substrate which visible light passes through. In this case, light that displays the image may be displayed through the transparent substrate.

External light may pass through the transparent substrate. By way of a non-limiting and specific example, the transparent substrate may be configured to include at least glass or plastic. In another example, the substrate 110 may be configured to have rigidity or flexible characteristics. Therefore, the external light may pass through the transparent substrate 110.

The insulating film 121 and the supply voltage electrode 122 may be disposed on the substrate 110.

The supply voltage electrode 122 may supply power to the micro LED array 140 to be described later. Therefore, the supply voltage electrode 122 may be made of an electrically metallic material having a low resistance property, for example, including one of copper (Cu), copper alloy, aluminum (Al), aluminum alloy (AlNd), molybdenum (Mo), and moly-titanium (MoTi). However, the present disclosure is not limited thereto.

The insulating film 121 may be disposed between adjacent supply voltage electrodes 122. The insulating film 121 may be made of an organic or inorganic insulating material. Further, the insulating film 121 may have a stack structure of a layer made of an organic insulating material and a layer made of an inorganic insulating material.

The insulating film 121 may include an organic material such as PMMA and polyimide, or an inorganic material such as silicon oxide ($SiO_x$) or silicon nitride ($SiN_x$).

The thin-film transistor array 130 may be disposed on the insulating film 121 and the supply voltage electrode 122.

In a non-limiting example, the thin-film transistor array 130 may include a semiconductor layer, a first metal layer overlapping the semiconductor layer so as to provide a scan signal, a first insulating layer electrically insulating the semiconductor layer and the first metal layer from each other, a second metal layer electrically connected to the semiconductor layer and electrically insulated from the first metal layer, and a second insulating layer electrically insulating the first metal layer and the second metal layer from each other.

The semiconductor layer may be made of silicon, poly-silicon, oxide semiconductor, or the like. A portion of the semiconductor layer may be doped with impurities and thus may conductive. This conductive portion may act as a source or a drain. A portion of the semiconductor other than this conductive portion may act as a channel. However, the present disclosure is not limited to the material of the semiconductor layer.

The first metal layer may act as a gate line, a data line, or a portion of a bridge. For example, a portion of the first metal layer may be configured to implement a function of a gate line. For example, the first metal layer may be made of a metal material having a low resistance characteristic, for example, one of aluminum (Al), aluminum alloy (AlNd), copper (Cu), copper alloy, molybdenum (Mo), or moly-titanium (MoTi). However, the present disclosure is not limited thereto.

The first insulating layer may be disposed between the semiconductor layer and the first metal layer. The first insulating layer may be made of an inorganic insulating material. For example, the first insulating layer may include silicon oxide ($SiO_x$) or silicon nitride ($SiN_x$). A contact hole may be formed in the first insulating layer so that a conductive material above the first insulating layer and a conductive material below the first insulating layer are electrically connected to each other. For example, the first insulating layer may be embodied as a gate insulating film. However, the present disclosure is not limited thereto.

The first insulating layer may be configured to have a property such that visible light passes therethrough. In this case, the external light may pass through the first insulating layer.

The second metal layer may act as a gate line, a data line, or a portion of a bridge. For example, a portion of the second metal layer may be configured to implement a function of a data line. For example, the second metal layer may be made of a metal material having a low resistance property, for example, one of aluminum (Al), an aluminum alloy, copper (Cu), a copper alloy, molybdenum (Mo), or moly-titanium (MoTi). However, the present disclosure is not limited thereto.

The second insulating layer may be disposed between the first metal layer and the second metal layer. The second insulating layer may be made of an inorganic insulating material. For example, the second insulating layer may include silicon oxide ($SiO_x$) or silicon nitride ($SiN_x$). A contact hole may be formed in the second insulating layer so that conductive materials respectively above and below the second insulating layer are electrically connected to each other. However, the present disclosure is not limited thereto.

The second insulating layer may be configured to have a property that visible light passes therethrough. In this case, the external light may pass through the substrate 110, the first insulating layer, and the second insulating layer.

The micro LED array 140 may be disposed on the thin-film transistor array 130.

The micro LED display device 100 according to one embodiment of the present disclosure has a different feature in terms of an arrangement of the micro LED array 140 from a feature of a conventional micro LED display device in which R, G, and B sub-pixels are simply and repeatedly arranged within one pixel.

Specifically, in the micro LED display device 100 according to one embodiment of the present disclosure, four sub-pixels constitutes one pixel. In this case, the four sub-pixels may include three sub-pixels corresponding to R, G, and B, respectively, and one sub-pixel corresponding to any one of R, G, or B.

One pixel may include a micro LED area 141 disposed in a middle region thereof and a pixel circuit area 142 disposed on each of both opposing sides of the micro LED area 141. In this case, the four sub-pixels may be disposed in the micro LED area 141 disposed in the middle region of one pixel. A thin-film transistor array may be disposed under the pixel circuit area 142 disposed on each of both opposing sides of the micro LED area 141.

More specifically with reference to FIGS. 3 and 4, the four sub-pixels may be respectively disposed in a first quadrant 141-1 to a fourth quadrant 141-4 within the micro LED area 141 disposed in the middle region of one pixel. In this regard, a position of each of the R, G, and B sub-pixels in each of the quadrants is not limited. However, for convenience in terms of a process or a mask design, positions of the sub-pixels in each pixel may be the same or may be repeated periodically across all of the pixels.

As shown in FIG. 4, the supply voltage electrode 122 may be disposed directly under the micro LED area 141 of the micro LED display device 100 according to one embodiment of the present disclosure.

In this case, it is beneficial that the supply voltage electrode 122 be disposed directly below the four sub-pixels in the micro LED area 141 so that the four sub-pixels share the supply voltage electrode 122 with each other. When the supply voltage electrode 122 is disposed directly below the sub-pixels in this way, a distance between the supply voltage electrode 122 and the micro LED disposed in the sub-pixel may be reduced or minimized. As a result, voltage drop (IR drop; I: current; R: resistance) occurring between the supply voltage electrode 122 and the micro LED may be reduced or minimized, which may be advantageous for implementation of the large area. In addition, the arrangement of the supply voltage electrode 122 and the sub-pixels as described above may reduce or minimize a size reduction of a display area due to encroachment of the supply voltage electrode 122 thereto. This may achieve the high resolution.

In particular, for the uniformity of the micro LED panel, it is more beneficial that as shown in the plan view of FIG. 3, the supply voltage electrode in one pixel is disposed in a middle region of an area corresponding to the sub-pixels in one pixel. In this case, since the sub-pixels within one pixel having the same positional relationship relative to the supply voltage electrode uniformly share the supply voltage electrode, the sub-pixels within the same pixel may receive uniform supply voltage power.

Further, a width or a thickness of the supply voltage electrode is not particularly limited.

However, it is beneficial that a minimum value of the width of the supply voltage electrode be larger than a spacing between adjacent sub-pixels within the micro LED area 141. Due to this spatial arrangement, a path along which the supply voltage electrode applies the voltage to each of the sub-pixels may be reduced such that the voltage drop (IR drop) may be reduced or minimized.

In a non-limiting and specific example, based on FIG. 3, the width W4 of the supply voltage electrode 122 may be larger than a spacing S between a sub-pixel disposed in the first quadrant 141-1 and a sub-pixel disposed in the second quadrant 141-2, or may be larger than a spacing S between a sub-pixel disposed in the third quadrant 141-3 and a sub-pixel disposed in the fourth quadrant 141-4.

In this regard, a maximum value of the width W4 of the supply voltage electrode 122 may be smaller than a width W5 of the micro LED area 141. Due to this spatial arrangement, the supply voltage electrode 122 does not invade the pixel circuit area 142 next to the micro LED area 141.

Figure 5:
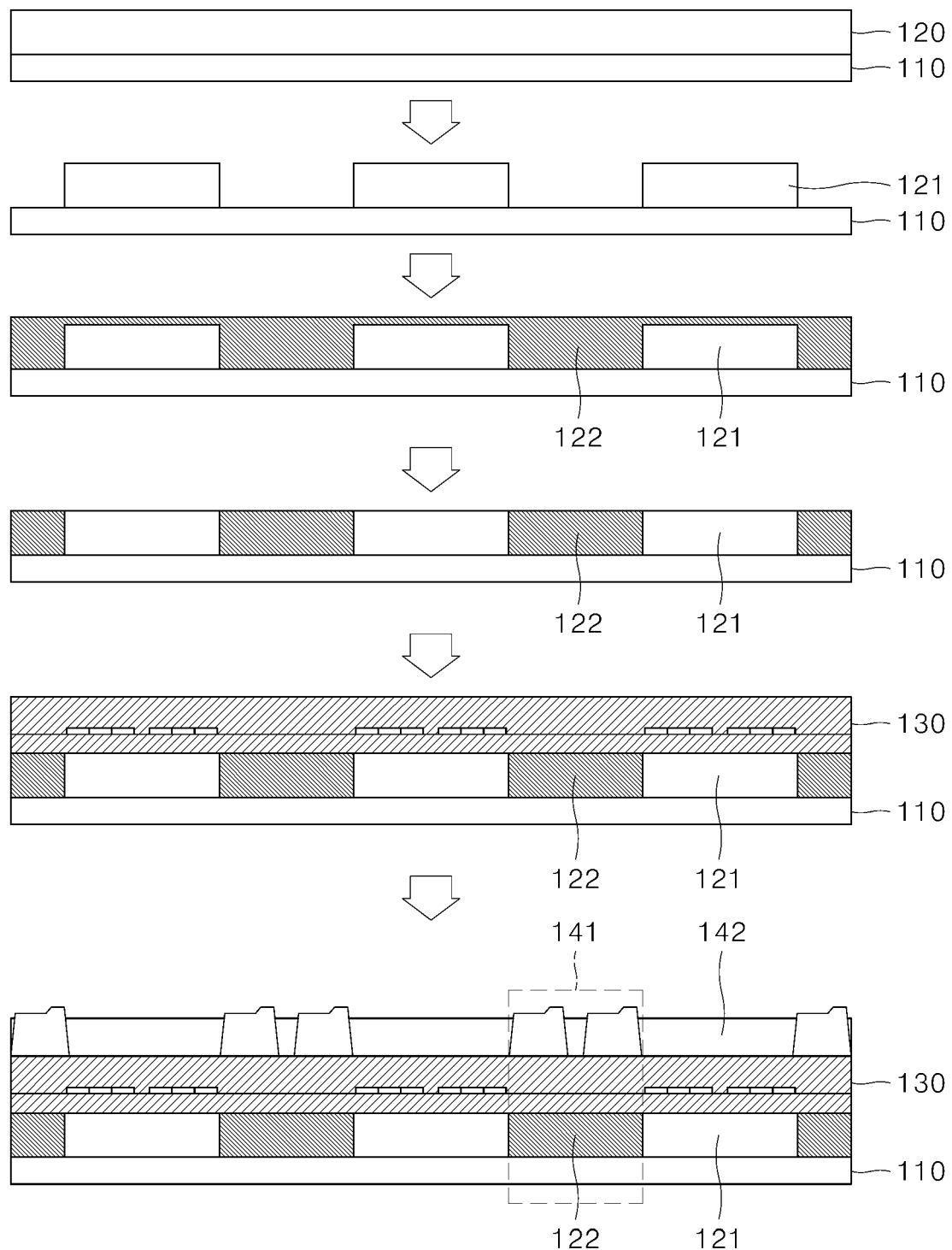
FIG. 5 is a cross-sectional view for illustrating a method for manufacturing a micro LED display device according to one embodiment of the present disclosure.

FIG. 5 is a cross-sectional view for illustrating a method for manufacturing a micro LED display device according to one embodiment of the present disclosure.

Figure 6:
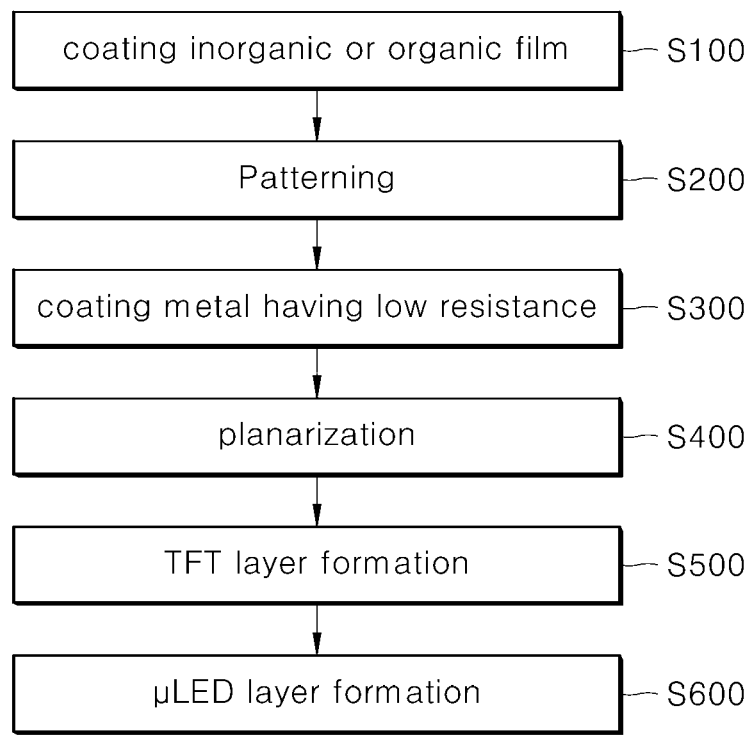
FIG. 6 is a flowchart for illustrating a method for manufacturing a micro LED display device according to one embodiment of the present disclosure.

FIG. 6 is a flowchart for illustrating a method for manufacturing a micro LED display device according to one embodiment of the present disclosure.

A method for manufacturing a micro LED display device according to one embodiment of the present disclosure may first include a process S100 of coating an insulating film 121 as an inorganic or organic film on the substrate 110.

When the insulating film 121 includes an inorganic film, the insulating film 121 may be deposited on the substrate 110 using chemical vapor deposition (CVD) in a non-limiting example. In another example, when the insulating film 121 is made of an organic material, the insulating film 121 may be formed using an organic material coating method, for example, a printing or coater method. In this case, the insulating film 121 may be coated on an entirety of the substrate 110 in a beta coating manner and then may be patterned or may be coated only on a desired area (or selected area) using a patterned mask.

Next, the coated or deposited insulating film 121 may be processed into a shape having a desired pattern via a patterning process S200. However, when the insulating film 121 is coated or deposited in a pattern other than a beta film in the process of forming the insulating film 121, the patterning process S200 may be omitted.

Next, a process S300 of coating a supply voltage line between adjacent portions of the patterned insulating film 121 may be performed to form the supply voltage electrode 122. In this case, the supply voltage line coating process S300 may be performed via physical vapor deposition (PVD) or chemical vapor deposition (CVD) or plating.

In one example, the insulating film formation process S100 and the supply voltage line coating process S300 may be performed in an exchanged order with each other. In other words, first, a patterned electrode line may be formed via a metal deposition process and a patterning process, and the insulating film 121 may be formed between adjacent portions of the patterned electrode.

Next, the substrate on which the insulating film 121 and the supply voltage electrode 122 have been formed may be planarized via a planarization process S400.

The planarization process S400 refers to a process to prevent defects due to irregularities of the substrate during a subsequent process. In a non-limiting and specific example, the planarization process may be performed via a CMP (chemical mechanical polishing) process.

After the planarization process S400, a TFT thin-film transistor array formation process S500 may be performed.

In a non-limiting and specific example, in order to form the thin-film transistor array 130 as described above, the TFT array formation process S500 may be configured to sequentially include a semiconductor layer formation process, a first metal layer formation process that forms the first metal layer overlapping with the semiconductor layer and providing a scan signal, a first insulating layer formation process that forms the first insulating layer for electrically insulating the semiconductor layer and the first metal layer from each other, a second metal layer formation process for forming the second metal layer electrically connected to the semiconductor layer and electrically insulated from the first metal layer, and a second insulating layer formation process for forming the second insulating layer which electrically insulates the first metal layer and the second metal layer from each other.

In another example, the thin-film transistor array formation process may be modified depending on a shape or a material of the thin-film transistor.

A micro LED array formation process S600 may be performed to form the micro LED on the TFT array formed by the TFT array formation process S500.

The micro LED array formation process S600 refers to a process of forming the micro LED including the sub-pixels in the micro LED area 141.

The micro LED array formation process S600 may be formed using a method known in the art to which the present disclosure belongs.

In a non-limiting and specific example, the micro LED array formation process S600 may be performed by transferring the micro LED as separately manufactured on the substrate on which the TFT has been formed by the TFT array formation process S500.

In this case, the micro LED is typically a LED with a size of 10 to 100 μm. After a plurality of thin-films made of an inorganic material such as Al, Ga, N, P, As, and In is grown on a sapphire substrate or a silicon substrate, the sapphire substrate or the silicon substrate is cut into pieces which are separated from each other. Thus, the micro LED is formed. The micro LED is formed to have a fine size, and thus may be transferred to a flexible substrate such as a glass or organic plastic substrate. Thus, the micro LED display device may be manufactured. In addition, unlike an organic light-emissive diode such as OLED, the micro LED is formed by coating or depositing the inorganic material, and thus the manufacturing process thereof is relatively easy and a yield thereof is high.

In addition, the micro LED array formation process S600 may be implemented by directly manufacturing the micro LED on the substrate on which the TFT has been formed by the TFT array formation process S500 via the coating or deposition process.

However, it is beneficial that the micro LED layer in the micro LED array formation process S600 has the spatial arrangement as described in FIG. 3.

Specifically, in the micro LED array formation process S600, the micro LED may be arranged only in the micro LED area 141, and the supply voltage electrode 122 may be disposed directly below the micro LED area 141.

More specifically, it is beneficial that the supply voltage electrode is disposed directly below the four sub-pixels in the micro LED area 141 so that the four sub-pixels uniformly share the supply voltage electrode 122 with each other. due to this arrangement relationship, a distance between the supply voltage electrode 122 and the micro LED disposed on different layers may be reduced or minimized, so that the voltage drop (IR drop) may be reduced or minimized.

In this case, it is more beneficial that, as shown in the plan view of FIG. 3, the supply voltage electrode in one pixel is disposed in the middle region of an area corresponding to the sub-pixels in one pixel. Due to this arrangement relationship, spacings between the sub-pixels within the same pixel and the supply voltage electrode 122 may be equal to each other so that a uniform supply voltage may be applied thereto.

Although not shown in FIGS. 3 to 6, a plurality of gate lines and a plurality of data lines are arranged on the substrate 110 and in vertical and horizontal directions to define a plurality of pixel areas in a matrix structure. In this case, the gate line and the data line are connected to the micro LED array 140, and a gate pad and a data pad connected to an external component may be disposed at ends of the gate line and the data line, respectively. Accordingly, when an external signal is applied to the micro LED array 140 through the gate line and the data line, the micro LED display device 100 may operate and emit light.

According to another embodiment of the present disclosure, the supply voltage electrode 122 may act as the data line.

Due to the above electrode arrangement, while a separate supply voltage electrode 122 is not formed, an existing data line may be used as the supply voltage electrode 122 line. This has an advantage of shortening a process and improving productivity.

Embodiments of the present disclosure may be described as follows.

A micro LED display device according to embodiments of the present disclosure includes a substrate, a supply voltage line on the substrate, and a micro LED area disposed on the supply voltage line, and at least one portion of the supply voltage line is disposed directly below the micro LED area.

The supply voltage line may be divided into a plurality of portions. The device further comprises an insulating layer may be disposed between adjacent portions of the supply voltage line.

The device may further comprise a TFT array disposed between the supply voltage line and the micro LED area.

The micro LED area may include four sub-pixels per a single pixel. The four sub-pixels may be respectively disposed in first to fourth quadrants.

The four sub-pixels may include three sub-pixels corresponding to R, G and B, respectively, and a remaining one sub-pixel corresponding to one of R, G or B.

Spacings between the four sub-pixels and the supply voltage line may be substantially equal to each other.

A width of the supply voltage line may be greater than a spacing between adjacent ones of the sub-pixels.

A width of the supply voltage line may be smaller than a width of the micro LED area.

A pixel circuit area may be disposed on each of both opposing sides of the micro LED area within a single pixel.

A micro LED display device according to another embodiment of the present disclosure includes a substrate, a supply voltage line on the substrate, and a micro LED area disposed on the supply voltage line, and at least one portion of the supply voltage line is disposed directly below the micro LED area. The supply voltage line acts as a data line.

A method for manufacturing a micro LED display device according to an embodiment of the present disclosure may include a process of coating an insulating film on a substrate, a process of coating a supply voltage line on the substrate, a process of forming a TFT array on the insulating film and the supply voltage line, and a process of forming a micro LED array on the TFT array.

The process of coating the supply voltage line on the substrate may be performed before the process of coating the insulating film on the substrate.

The method further may comprise a planarization process between the process of coating the supply voltage line on the substrate and the process of forming the TFT array on the insulating film and the supply voltage line.

The method may further comprise a patterning process after the process of coating the insulating film on the substrate or the process of coating the supply voltage line on the substrate.

The micro LED array may include four sub-pixels per a single pixel, wherein the four sub-pixels are respectively disposed in first to fourth quadrants.

The four sub-pixels may include three sub-pixels corresponding to R, G and B, respectively, and a remaining one sub-pixel corresponding to one of R, G or B.

Spacings between the four sub-pixels and the supply voltage line may be substantially equal to each other.

A width of the supply voltage line may be greater than a spacing between adjacent ones of the sub-pixels.

The four sub-pixels may constitute a micro LED area in a single pixel. A pixel circuit area may be disposed on each of both opposing sides of the micro LED area.

A method for manufacturing a micro LED display device according to another embodiment of the present disclosure includes a process of coating an insulating film on a substrate, a process of coating a supply voltage line on the substrate, a process of forming a TFT array on the insulating film and the supply voltage line, and a process of forming a micro LED array on the TFT array. The supply voltage line acts as a data line.

The above description is merely an example description of the present disclosure, and various modifications may be made by those of ordinary skill in the technical field to which the present disclosure belongs and within the scope that does not deviate from the technical idea of the present disclosure. Therefore, the embodiments disclosed in the specification of the present disclosure do not limit the present disclosure. The scope of the present disclosure should be interpreted based on the claims below, and features within a scope equivalent thereto should be interpreted as being included in the scope of the present disclosure.

REFERENCE NUMERALS

100: electroluminescent display device
110: substrate
120: insulating film and supply voltage electrode layer
121: insulating film
122: supply voltage electrode
130: thin-film transistor array
140: micro LED array
141: micro LED area
141-1: first quadrant
141-2: second quadrant

141-3: third quadrant
141-4: fourth quadrant
142: pixel circuit area
S100: process of forming insulating film
S200: patterning process
S300: process of coating supply voltage line
S400: planarization process
S500: TFT array formation process
S600: micro LED array formation process The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A micro light emitting diode (LED) display device comprising:
    a substrate;
    a supply voltage line disposed on the substrate;
    a micro LED area disposed on the supply voltage line, and
    a thin film transistor (TFT) array disposed between the supply voltage line and the micro LED area,
    wherein at least one portion of the supply voltage line is disposed directly below the micro LED area.

2. The micro LED display device of claim 1, wherein the supply voltage line is divided into a plurality of portions,
    wherein the device further comprises an insulating layer disposed between adjacent portions of the supply voltage line.

3. The micro LED display device of claim 1, wherein the micro LED area includes four sub-pixels per a single pixel,
    wherein the four sub-pixels are respectively disposed in first to fourth quadrants.

4. The micro LED display device of claim 3, wherein the four sub-pixels include three sub-pixels corresponding to R, G, and B, respectively, and a remaining one sub-pixel corresponding to one of R, G, or B.

5. The micro LED display device of claim 3, wherein spacings between the four sub-pixels and the supply voltage line are equal to each other.

6. The micro LED display device of claim 5, wherein a width of the supply voltage line is greater than a spacing between adjacent ones of the sub-pixels.

7. The micro LED display device of claim 5, wherein a width of the supply voltage line is smaller than a width of the micro LED area.

8. The micro LED display device of claim 3, wherein a pixel circuit area is disposed on each of both opposing sides of the micro LED area within a single pixel.

9. The micro LED display device of claim 1, wherein the supply voltage line acts as a data line.

* * * * *